United States Patent [19]
Rice et al.

[11] 4,334,008
[45] Jun. 8, 1982

[54] PHOTOSENSITIVE COMPOSITIONS OF POLYMER POLYNITRATE ESTER AND BASIC AROMATIC AMINE

[75] Inventors: John F. Rice, Nashua, N.H.; Albert P. Yundt, Medfield, Mass.; Kenneth J. Quast, Milford, N.H.

[73] Assignee: Bard Laboratories, Inc., Amherst, N.H.

[21] Appl. No.: 154,313

[22] Filed: May 29, 1980

Related U.S. Application Data

[63] Continuation of Ser. No. 734,649, Oct. 21, 1976, abandoned, which is a continuation of Ser. No. 560,565, Mar. 20, 1975, abandoned.

[51] Int. Cl.$^3$ .................................................. G03C 1/68
[52] U.S. Cl. .................................... 430/270; 430/269; 430/271; 430/292; 204/159.11; 204/159.14
[58] Field of Search ............... 430/270, 269, 271, 192, 430/322; 204/159.14, 159.11

[56] References Cited

U.S. PATENT DOCUMENTS 3,042,515  7/1962  Wainer ................................ 430/270
3,884,697  5/1975  Inoue et al. ......................... 252/300

OTHER PUBLICATIONS

Ott, *Cellulose and Cellulose Derivatives*, pp. 640–645, 1104–1109 (1943).
Hercules Publication, *Nitrocellulose Chemical and Physical Properties*, pp. 38–44, 1969.
Venkataraman, The Chemistry of Synthetic Dyes, vol. 2, pp. 767–773 (1952).
Sprague et al., Photographic Science and Engineering, 5, pp. 98–103 (1961).
Marshall, Explosives, vol. III, 1932, pp. 224–598.
Wise, Wood Chemistry, vol. 40 (1962), pp. 1–25.
Kosar, *Light Sensitive Systems*, (1965), pp. 362–380.
Hayward et al., Canadian J. Chem., vol. 40 (1962), pp. 434–440.
Marqueyrol, An Analysis of Various Stabilizers (Translation), 6/26/1936, pp. 2240–2251.

*Primary Examiner*—Jack P. Brammer
*Attorney, Agent, or Firm*—Sewall P. Bronstein; George W. Neuner

[57] ABSTRACT

Photosensitive compositions containing nitrate ester chain polymers, such as nitrocellulose, molecularly intimately admixed with at least one compound having a free basic amine group, preferably a primary amine group, directly attached to an aromatic ring carbon. On suitable exposure to ultraviolet light, such compositions will print out a useful image directly, or, should a much lesser light exposure be preferred, they can be developed and fixed to an image intensified to useful strength by either heat alone, for amines that are sufficiently volatile at ingredient reaction temperatures, or by solvent selective removal of ingredients from unexposed areas, and subsequently intensified either by heat or overall ultraviolet exposure. Exposed areas of such compositions are more resistant both to volatilization of the amines and to solvent removal than the non-exposed areas. High optical density is attainable using very thin coatings, permitting high resolution grainless images. If developed by solvent selective removal of all ingredients from unexposed areas, the composition is useful as a photoresist material.

62 Claims, No Drawings

PHOTOSENSITIVE COMPOSITIONS OF POLYMER POLYNITRATE ESTER AND BASIC AROMATIC AMINE

This is a continuation of application Ser. No. 734,649 filed Oct. 21, 1976, now abandoned which is a continuation of application Ser. No. 560,565 filed Mar. 20, 1975, now abandoned.

BACKGROUND OF THE INVENTION

The present invention relates to non-silver photosensitive compositions. More particularly, it relates to such compositions comprising, as components, certain aromatic amines and nitrate ester type chain polymers, which components co-react on suitable exposure to ultraviolet light, thereby sufficiently altering the physical properties of the composition to either directly yield a visible and useful image or, with lesser required exposure, be simply and easily developed and fixed to useful images, including compositions useful in direct service as photoresists.

The admixture of small amounts of certain aromatic amines with smokeless powder nitrocellulose has been variously suggested for stabilizing the powder against degradation effects ("Cellulose and Cellulose Derivatives", E. Ott, p 643 Interscience Publishers, 1943). The development of color upon subsequent oxidation of the amines is not a factor in such service.

The oxidation of aromatic amines to form dyes and colorants is old and widely practiced art ("The Chemistry of Synthetic Dyes", K. Verkataraman, especially pp 767–779, Academic Press, 1952). Many oxidants, including nitric acid and its decomposition products, have been employed.

It was also previously known that organic polyhalogen compounds could be combined with aryl amines in photosensitive compositions, wherein the organic polyhalogen compounds were activated by visible or ultraviolet light to generate free radicals, which reacted with the aryl amines to form colored products. See, e.g. Kosar, "Light Sensitive Systems", pp 361–380 (1965); U.S. Pat. No. 3,042,515 to Eugene Wainer. In such systems, the polyhalogen compound and amine were generally encompassed within a plastic film former or base of some sort. The polyhalogen compounds, in addition to providing a material which is photolytically activated to react with the aryl amine to form the colored products, may also form coordination compounds with certain amines, which coordination compounds may themselves further photolytically react. The effect of the ability to form coordination compounds is to extend the photolytic sensitivity of the composition to longer wavelengths of light.

There are a wide variety of plastics which have been used as the binder in systems such as Wainer's. Wainer preferred that the base material be a hydrogen donor (i.e., reducing agent), in which case the overall color-forming reaction was postulated by Wainer as one in which the polyhalogen compound is photolytically activated to form free radicals, in the presence of which the plastic base gives up free hydrogen radicals, with the halogen adding to the amine side chain and the hydrogen of alkyl groups produced adding either to the aryl nucleus or to the plastic base. See U.S. Pat. No. 3,042,515, the disclosure of which is hereby incorporated by reference, especially columns 2–3.

Not all of the plastic binders used have been hydrogen donors even though such materials have been preferred. In fact, a large number of other materials, which are not normally so classified, have been used, including commercially available cellulose polymers, such as ethyl cellulose, cellulose acetate and cellulose nitrate.

Thus, while not preferred, there have been photoreactive systems containing certain aromatic amines, a photoactivatable polyhalogen compound, and a celluse nitrate binder. However, so far as we are aware, in all prior systems where a nitrate ester polymer such as nitrocellulose is suggested or used as a component of photooxidation imaging systems, including those in which copresent amines are photooxidized to a color, e.g., as in Wainer, it serves solely as an inert substrate or binder, the photooxidation being accomplished by other, more readily activated ingredients such as the halo compounds of Wainer. Thus nowhere is it indicated that the color or course of the reaction differs when nitrocellulose is used as the binder in such systems.

It has also been known to form solvent soluble esters of cellulose by using organic acids, all or part of which contain unsaturated carbon linkages of a type adapted to photoinduce crosslinking, e.g., cinnamic acid, for service as a conventional photocrosslinkable photoresist polymer coating.

Apart from prior knowledge in the field of photographic or photoimaging compositions, the chemistry of photoinitiated reactions between monomeric compounds having nitrate ester groups with certain diphenylamines was studied in Hayward et al., "Photolysis of Nitrate Esters, Part I. Photonitration of Diphenylamine", Canadian Journal of Chemistry, 40, pp 434–440 (1962). That paper indicates that ultraviolet photon absorption by diphenylamine peaks at 285 nm and extends to 335 nm, but that model nitrate ester compounds with ring structure comparable with cellulose do not absorb above 240 nm. Hence, though impurities or local sites of degradation reactions, etc. may make a nitrocellulose absorb longer wavelengths somewhat, the nitrate ester groups of nitrocellulose are not photoactivated by wavelengths above 240 nm either. Howard et al. state that mixtures of diphenylamine and their monomeric nitrate ester compounds do develop color on prolonged exposure to ultraviolet wavelengths which are not absorbable by the nitrate esters but are absorbable by diphenylamine. Their work concerns possible uses in chemical manufacture and contains no suggestion either of possible photographic or imaging applications or of using nitrate ester polymers such as nitrocellulose.

SUMMARY OF THE INVENTION

We have found that when nitrate ester chain polymers, especially nitrocellulose, are molecularly intimately admixed with certain aromatic amines and exposed to ultraviolet light of wavelengths absorbed by the amine, the thus-activated amine molecules chemically react with the nitrate ester groups of the polymer, yielding products which are more light absorbing. Not only does this permit the direct production of usefully visible images, but the chemically altered polymer polynitrate is rendered less thermally mobile and less readily swollen or dissolved by certain solvents, especially those of relatively large molecular size which also are marginally active (as evidenced by loss of their polymer polynitrate swelling or dissolving activity upon slight dilution with non-solvents free of co-solvent tendencies such as, for service with nitrocellulose, heptane). Further, we find that these changes in the properties of the polymer polynitrate are sufficiently pronounced that a much lessened light exposure, sufficient only to produce a faintly visible image, can be sufficient to permit extractive or thermal evaporative removal of color formers from unexposed areas, yet leave the exposed areas relatively unaffected, thus permitting subsequent exhaustive reaction to develop maximum color potential in the exposed areas either by prolonged overall irradiation or simply by heating sufficiently to thermally react the ingredients. Selective solvent removal of all ingredients from only the unexposed areas yields a system with the necessary properties for use in photoresist service, for which purpose color development is unimportant.

An object of the invention is to provide a method of converting spatial variations in the intensity of actinic radiation into physical images in a high molecular weight material.

Another object of the invention is to provide a means of utilizing the above process to produce high resolution images of high and uniform contrast with sharply defined edges from actinic irradiation patterns of relatively low and uneven contrast.

Another object of the invention is to provide a novel photoactivated recording and copying means having advantageous properties over the prior art.

Another object of the invention is to use the above processes to photoproduce stencil-like voids or openings in an elsewhere physically protective coating for photoresist type applications.

Other objects and advantages of the present invention will be apparent to those skilled in the art from the following description or from practice of the invention herein disclosed.

The present invention takes advantage of the attack on nitrates by certain photoactivated aromatic amines intimately admixed therewith, and the consequential effects such attack has on the physical properties of the composition. A number of factors affect the selection of amines best suited for a given end use.

While not wishing to be bound by theory, standard theories on the effects of structural changes upon the color of dyes (see, e.g., "The Chemistry of Synthetic Dyes", K. Venkataraman, Ch. VIII, pp 323–400, Academic Press, 1952) appear helpful in deciding which amines would be expected to absorb the longer wavelengths of ultraviolet light. These wavelengths are more conveniently used because they are passed by ordinary glass used for lamps, lenses, photographic plates, etc. Most normal dyes are considered to possess an electrically resonant structure such as an aromatic ring (which can be considered a conjugated double bond chain structure of somewhat moderated electroconductive activity), coupled with one or more additional, preferably electrically polar, structures (chromophores) containing double bonds which can act as uninterrupted extensions of the ring "conjugation", plus additional polar groups (auxochromes), such as amine, hydroxyl, methoxyl and even methyl groups. The greater the uninterrupted length of the conjugation chain, the lower the frequencies for which natural resonant photon absorption bands will occur, and the presence of auxochromes will lower and broaden these absorption bands still further. For present purposes, however, as we wish to maximally activate the amine group, chromophore groups are generally undesirable because part of the absorbed photon's energy would resonate through them instead. However, the absorption frequency of aromatic amines can be lowered to the longer U.V. wavelengths by use of the coupled "conjugation" of fused aromatic rings (such as naphthalene), and additional auxochromes, such as methoxyl or additional amino groups.

Practical considerations dictate that the amine should be sufficiently compatible with the type and grade of polymer used so as to not crystallize out. Nor should it be so volatile that, as with the lowest molecular weight aromatic amine, aniline, it is difficult to retain during drying of a solvent-based coating of the composition. Neither should it be so strong in basic character as to rapidly strip off the nitrate ester groupings during storage by reason of basic activity alone. Handbook tables of ionization constants of amines and standard theory of the effects of structure changes on basicity are helpful here. Conversion to the hydroxylamine form lowers basicity, but the storage stability of most hydroxylamines is quite poor. Neither should the amine be so reactive with atmospheric oxygen as to degrade excessively before it can be used. Most ortho, and especially para, primary diamines and hydroxyamines are bad in this respect. Also, the amine is not active in the salt form so even inner salt formation, including with strongly acidic phenolic groups, can greatly depress activity. However, the color, once produced, may, in some instances, be more advantageous. Presence of an activated ring hydrogen ortho or, preferably, para to the amine group can also be helpful in color development. Peridiamines, such as 1, 8 diaminonaphthalene, are especially desirable. Such amine groups are actually closer spaced than if in the ortho position and can envelop a nitrate ester group, clinging tightly despite their (otherwise desirable) low basicity. Color development is strong and resistance to air oxidation is much better than with the ortho positioning which can form a quinone.

Aromatic amines which are useful in this invention may generally be described by the formula:

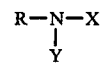

wherein R is an aromatic nucleus such as benzene, naphthalene or anthracene nucleus, which may be either substituted or unsubstituted, e.g., with alkyl, halogen or aryl groups, and X and Y are the same or different and are selected from the group of alkyl, aryl and alkaryl, which may be either substituted or unsubstituted, and hydrogen, or either X or Y, but not both, may be hydroxyl. It is believed that to be effective the aromatic amine should be relatively basic, and should not have its effective basicity substantially nullified, e.g. by formation of salts or amides.

In general, all else being equal, activity and color development tends to be better for primary amines. The highly polar nitrate group would be expected to attract the complimentary polarity of the amine group to form a rather close pair in the absence of steric hinderance from other substituents. Additionally, tertiary, and, to a lesser extent, secondary amines, unless photodegraded, are more resistant to oxidation, principally yielding only the milder, generally yellow, color development effects of nitration and nitrosolyation. The free base and leuco forms of tertiary amine basic dyes are a particular exception, of course, because, for the free base form, the full dye color develops immediately on salt formation with a liberated acid group or, for some leuco types, additionally only after a simple oxidation.

Nitrocellulose is commercially available in several degrees of nitration and several average chain length ranges. The latter is specified commercially by stating the product's solution viscosity under arbitrary standard measurement conditions. The present invention is believed workable with the whole range of commercially available nitrocelluloses, which are believed to range from about 10.0% to about 13.5% nitrogen and from less than about 0.1 seconds to over 5000 seconds viscosity. It has been demonstrated as workable using commercial nitrocellulose grades ranging from 10.6 to 13.5% nitrogen content and with viscosities from ⅛ to 1500 seconds. Best results have generally been obtained using material analyzing 11.7 to 12.0% nitrogen content, indicating that about one-third of the available hydroxyl groups were not esterified. With regard to chain length, the nitrocellulose preferably has a viscosity of from about ¼ seconds to 10 seconds, best results with preferred amines being obtained using nitrocellulose having what is commercially designated as ½ second viscosity, corresponding to an intrinsic viscosity of about 0.77 deciliters per gram. Generally, too long chain lengths give compositions which are more difficult to remove by solvents or heat, and nitrocellulose having chain lengths which are too short will not be acceptable for use as a binder.

Solvents are conveniently used to dissolve the ingredients of the composition to facilitate the required molecularly intimate admixture and to permit coating the material on the desired substrate. The solvents and solvent mixtures generally recommended for nitrocellulose coatings dissolve most aromatic amines. However, there are special requirements that make some more desirable than others. The solvent chosen should be readily and completely removable under the thermally mild drying conditions required to avoid both loss of the amine by volatilization and thermal reaction between ingredients. Esters work, but we generally prefer medium volatility ketones. Diethylketone diluted with half of its volume each of toluene and n-propyl alcohol is an example of an acceptable solvent mixture.

Coating may be done by any of the well known standard techniques suitable for nitrocellulose lacquers. For the examples to be described, coating was done either using a conventional plate spinner or a wirewound metering rod, results being the same for a given dry coating thickness. Spraying, dipping and roll printing have also been successfully used.

EXAMPLES

A number of typical aromatic amines of widely varying structure were tested for color development by this invention. Six parts by weight of amine was intimately mixed with 10 parts by weight of nitrocellulose in methyl ethyl ketone solution, made into a 15% total solids solution in methyl ethyl ketone, and coated onto glass and dried. The coatings were exposed through a suitable imaging mask for 20 minutes at close range to a pair of 7½ watt fluorescent light bulbs having an ultraviolet emitting phosphor to convert the co-generated shortwave ultraviolet to longwave ultraviolet light capable of being transmitted through the lamp's glass envelope (General Electric type F4T5-BL). The amines tested, together with the color obtained, if any, are given in Table I below:

TABLE I

| Example | Amine or Substitute | Color |
|---|---|---|
| 1 | 1-Naphthylamine | yellow-brown |
| 2 | 2-Naphthylamine | yellow-brown |
| 3 | 4-Chloro-1,3-phenylenediamine | brown |
| 4 | 3-Amino-9-ethyl carbazole | greenish tan |
| 5 | o-Tolidine | greenish tan |
| 6 | m-Phenylenediamine | yellow |
| 7 | p-Anilinophenol | tannish yellow |
| 8 | 2,5-Dimethoxy aniline | red-brown |
| 9 | 3,3'-Dimethoxybenzidene | yellow |
| 10 | 1,5-Diaminonaphthalene | purple-brown |
| 11 | 1,8-Diaminonaphthalene | yellow-brown |
| 12 | Diphenylamine | yellow |
| 13 | Triphenylamine | yellow |
| 14 | 6-Dimethylaminoquinaldine | dk. yellow-green |
| 15 | Tris 4-(N,N,-dimethylanilino)methane | deep blue |
| 16 | 4-Methoxyphenylhydroxylamine | tan |
| 17 | Diphenylhydroxylamine | yellow |
| 18 | Indole | brownish pink |
| 19 | Carbazole | none |
| 20 | Carbazole (+ short-wave U.V.) | faintly yellow |
| 21 | N-Vinyl carbazole | yellow |
| 22 | Isatin | none |
| 23 | Diphenylacetamide | weak yellow |
| 24 | Tetramethylenepentamine | none |
| 25 | Phthalonitrile | none |
| 26 | p-Dimethylaminobenzaldehyde | yellow |
| 27 | o-Nitroaniline | very slight reddish tint |

Examples 1 through 11 are primary amines or diamines and, for the most part, yielded deeper colors than the typical simple secondary and tertiary amines, Examples 12 and 13 respectively. Examples 14 and 15, both tertiary amines, indicate that this is not always so, however. The course of the secondary reactions in Example 14 is not known, but Example 15 represents a leuco (reduced) free amine form of crystal violet, a triphenyl methane type of basic dye. Color production is inappreciable unless both acidification and oxidation (of the remaining hydrogen of the methane carbon) occurs, so fair stability against premature color development is possible with proper precautions. Though they are much weaker bases and less stable, hydroxy-substituted amines, i.e., the hydroxylamines, are simply partially preoxidized amines and also work as shown by Examples 16 and 17.

In Example 18, indole,

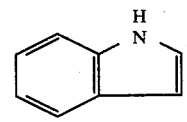

the nitrogen is part of a ring, but it is not an aromatic ring, and so could also be classed as a secondary amine directly attached to an aromatic ring. Response is weak but definite. Example 19, carbazole,

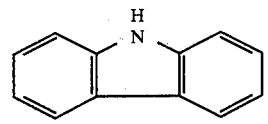

could be similarly classified however, and it gave no apparent development of color until reexposed an additional 15 minutes, Example 20, this time using shortwave ultraviolet from a small (4 watt) germicidal lamp (Example 20). While not wishing to be based on theory, there may be several causes for this much weaker than usual response. The (secondary) amine nitrogen of carbazole is only very weakly basic and also is sufficiently hindered structurally to make close approach to the nitrate ester groups difficult. Perhaps for these or other reasons, it is quite poorly compatible with the nitrocellulose. This is evidenced by the cloudy appearance of the coating and visibly obvious development of carbazole crystals. Thus, a cardinal requirement of the invention, namely, a molecularly intimate admixture of the ingredients, is not properly met. Additionally, the nitrogen atom is located midway between two benzene rings. When the adsorbed photon energy resonates electrically between them, it is believed that it would do so almost exclusively via the direct carbon bond between the two rings because the path via the two nitrogen single bonds in series is an electrically insulative interruption in the conjugation chain. Thus, most of the excitation energy would bypass the nitrogen atom, preferring the highly conductive "short circuit" path instead. Hence, though the compound absorbs the U.V. photon energy well, as evidenced by a bright blue-white fluorescence, very little of the energy would be available to excite the amine group, and, in addition, most of the amine group would probably be out of contact with the nitrate ester groups and so cannot attack them anyway. Despite all this, given a sufficiently short wavelength to excite a diagonal mode between the amine group and one ring instead of between the two rings, the system does work, providing the validity of the inventors' claims to generality. By attaching a vinyl group to the carbazole's nitrogen,

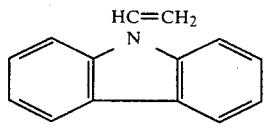

Example 21, it is converted to a tertiary amine, but with an added double bond. This greatly improved compatibility with the nitrocellulose, the vinyl group perhaps acting as a conductive "wand" to extend the "reach" of the amine's electrical charge. It would also make it easier for energy to resonate into the wand and thence back through the amine nitrogen. Color development rate is greatly increased.

Examples 22, 23, 24 and 25 show that certain compounds which are closely related to, but which are actually not aromatic amines, do not work under otherwise comparable conditions. Example 22, isatin,

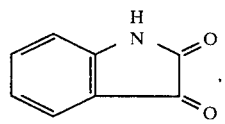

showed no color either. However, unlike indole, the aliphatic ring carbon attached to the nitrogen is also attached to a carbonyl group. Thus, in addition to the previously mentioned generally inhibitory effects of chromophore-type groupings, the nitrogen can be classed as an amide rather than an amine, and so is more acidic in nature than it is basic. Some amides do give a slight response, however, as shown in Example 23, diphenyl acetamide, probably reflecting impurities or a partial breakdown of the amide structure to yield the amine. Examples 26 and 27 show that, though the presence of chromophore groups on the ring (in one case an aldehyde, and in the other the much more potent nitro group) do reduce the response of the system, they do not completely block it.

Heat Fixing

As illustrations of an aromatic amine having a sufficiently high ratio of volatility to reaction rate at elevated temperatures to permit simultaneous image fixing and intensification by simple uncovered heating of the previously imaged coating, the following solutions were coated on glass with the aid of a No. 18 wire-wound metering rod (wet laydown, approximately 0.0010 inch) and well dried.

| Example Number | 28 | 29 |
|---|---|---|
| Nitrocellulose, 5–6 sec. viscosity, 12.0% N | 1.0 | 1.0 |
| Diphenylamine | 1.2 | 1.2 |
| Methyl ethyl ketone | 10.0 | 10.0 |
| Diacetone alcohol | 1.0 | 1.0 |
| Santicizer MHP (Toluene sulfonamide-formaldehyde resin plasticizer by Monsanto) | 0.0 | 1.0 |

Portions of the slides were imaged close to the pair of 7½ watt U.V.-fluorescing mercury lamps for 15 and 30 minutes. Though the images were markedly darker for the longer exposure times, they otherwise were about equal for the two samples. They were fixed by heating 15 minutes with the uncoated back side against a 130° C. hot plate. The exposed areas increased greatly in color density, those with the shorter exposure closely approaching the density of the longer exposure areas.

The Santicizer MHP altered the developed color from the yellow of Example 28 to a greenish yellow in Example 29. Addition of the Santicizer MHP plasticizer also aided diffusion to the surface and, thereby, the evaporation of the last traces of amine in the unexposed areas, leaving them clear with very sharp transitions to full color. In Example 28 this transition was less sharp and the unexposed areas were slightly discolored. Fixing was complete as indicated by absence of detectable differences after reexposing one-half of the sample, unmasked, for an additional 30 minutes. Optical density and contrast was excellent for the blue and ultraviolet lines of a mercury lamp, making it well suited for use as a working master for exposing ordinary photoresist coatings (which are only sensitive to blue and U.V. light). Its visual transparency at longer wavelengths presents an advantage in conventional microfabrication of integrated semiconductor circuits. This see-through characteristic facilitates visual microalignment of the mask pattern with any pattern present on the wafer from prior photofabrication steps.

Example 30

| Nitrocellulose, 5–6 sec. viscosity, 12.0% N | 1.0 |
|---|---|
| m-Phenylenediamine | 1.0 |
| Methyl ethyl ketone | 10.0 |
| Methyl isobutyl ketone | 10.0 |

When coated using a No. 10 rod, this more dilute formulation left only 28% of the dry film weight of Example 28, but yielded similar results after identical imaging and fixing. It showed good blue and U.V. opacity for use as a photoresist working master plate.

Fixing By Solvent Leaching

Solvent fixing of the exposed image permits much wider choice of the amine used, including ones that are but little volatilized from the unexposed areas on heating. Because less of such amines is lost from the exposed areas during subsequent thermal intensification of the image colors, acceptable optical densities are possible thereby from lighter weight, thinner films.

The following solutions were spin-coated at 1040 RPM on glass plates and well dried before imagewise exposure to ultraviolet light:

| Example Number | 31 | 32 |
|---|---|---|
| Nitrocellulose, 5-6 sec. Viscosity, 11.1% N | 1.0 | 1.0 |
| Methyl ethyl ketone | 7.3 | 7.3 |
| m-Phenylenediamine | 0.5 | — |
| 1,8-Diaminonapthalene | — | 0.5 |
| Imaging time, minutes | 10 | 4 |

The exposed plates, bearing weak but plainly visible images, were "cleared" by solvent-selective preferential extraction of amine from the unexposed areas by gently agitating the plates for 1 minute in a 9:1 weight ratio mixture of toluene:n-butanol. Any slight discolorations of the unexposed areas, whether caused by atmospheric oxidation of the amine or premature thermal reactions during drying and storage of such slides, leach out, along with the amine, from the slightly solvent-swollen unexposed nitrocellulose matrix. However, the exposed areas resist such swelling and are relatively little affected. The slides were quickly rinsed in heptane and dried. A strong overall exposure to ultraviolet light, e.g., 30+ minutes, serves to intensify the image. However, the particular amines specified in these examples were selected for masking service for exposing photoresist coatings on the basis of the ultraviolet absorption effectiveness of the image made using them. Consequently, as the image intensified, it absorbed most of the ultraviolet light, leaving very little available to activate residual unreacted amine and the color development rate was greatly slowed. Hence, thermal image intensification, e.g., 15 minutes on a 130° C. hotplate, is more appealing. Slightly greater image intensity was obtained when an overall ultraviolet exposure was used between the clearing and thermal intensification steps.

The "shutter" (exposed) areas of both these examples were sufficiently opaque to ultraviolet and blue light for commercial photomask service in exposing ordinary photoresist coatings. The "window" (unexposed) areas were quite clear, and transition from one to the other appeared very sharp when inspected under the microscope. There was no difficulty in contact printing the finest pattern of the standard resolution test target used, 228 line pairs/mm. These fine clear and opaque lines were reproduced, respectively, as opaque and clear lines of the same relative widths.

Solvent-Selective Coating Removal

The nitrocellulose can be extracted from the unexposed areas along with the amine. The formulations listed in Table 2 were spin-coated on glass plates at 1040 RPM. The plates were hot-dried thoroughly, exposed for the indicated times, and extracted by gently agitating in diisobutyl ketone for one minute, rinsed a few seconds in heptane containing 10% of isopropyl ether, dried, intensified by placing the uncoated side of the glass down against the surface of a 260° C. hot plate for 1 minute, and then cooled. The coating was effectively cleared from the unexposed areas in each case, leaving clear window areas.

TABLE II

| Example Number | 33 | 34 | 35 | 36 |
|---|---|---|---|---|
| Nitrocellulose, ½ sec. viscosity, 12.0% N | 1.00 | 1.00 | 1.00 | 1.00 |
| Diethyl ketone | 12.50 | 12.50 | 12.50 | 16.70 |
| 1,8 Diaminonaphthalene | 0.60 | — | — | — |
| Diphenylamine | — | 0.80 | — | — |
| 3,3' Dimethoxybenzidene | — | — | 0.50 | — |
| Tris 4-(dimethylanilino) methane | — | — | — | 0.40 |
| Imaging time, minutes | 6 | 20 | 15 | 20 |

Examples 34, 35 and 36 show that the ability to selectively dissolve the nitrocellulose from the unexposed areas, leaving the exposed areas relatively unaffected, is not peculiar to one amine. Because of the greater basicity of the amines used in Examples 35 and 36, only mild warming was permissable during drying or the unexposed areas would not extract properly. The intensified image of Example 36 was very dark blue, appearing virtually black when placed in contact with a white background. However, this is true only if intensification is by mild heating or, preferably, by a secondary strong ultraviolet light exposure. On strong heating, the colorant became brown and was much reduced in intensity.

Use as a Photoresist

Example 37. A composition similar to Example 35, but using only 8 parts of diethylketone, was similarly coated, but on the cleaned copper foil surface of a blank electronic printed circuit board, warm dried, and exposed through a suitable mask for 20 minutes. It was extracted 30 seconds in the following solvent mixture to completely clean off all unexposed coating, rinsed as before, and dried:

| Toluene | 60 |
|---|---|
| n-Butanol | 35 |
| Methyl ethyl ketone | 7 |

The coating image was then heated face down on a 260° C. hot plate for 2 minutes and cooled. A conventional aqueous ferric chloride etch removed all copper from the unexposed areas, leaving the surface unaffected where still protected by the composition of the invention in the ultraviolet light exposed areas. This protective coating was then removed from the copper remaining by a 5 minute immersion in a 30% aqueous solution of sodium hydroxide at 60° C. Other amines tested reacted similarly, showing that the process is a general one, being useful for photoresist service.

Non-Cellulose Polymers

That the photoreaction between accessible nitrate ester groups and the present class of amines is general rather than specific to the cellulose polymer backbone is apparent from the cited work of Hayward et al on monomeric nitrate esters. Hence, it is apparent that the invention should similarly serve for direct imaging applications if any otherwise suitable polymer bearing accessible nitrate ester groups were substituted for the nitrocellulose. Further, because of the photoproduced drastic changes in the nature of the polymer, including greatly increased opportunity for formation of hydrogen bond crosslinks between polymer chains, its susceptibility to suitable-chosen border-line solvents would vary markedly between exposed and unexposed areas. Thus, the same post-exposure processing techniques used with the nitrocellulose-containing embodiments of the invention would, appropriately modified, serve similarly. Special advantage accrues in the case of photoresist service because a polymer backbone resistant to acid hydrolysis could be used, for example, the nitrate ester derivative of poly(vinyl alcohol) or polybutadiene modified by adding nitric acid to its double bonds.

The only commercially offered polymeric nitrate esters readily available to the applicants were the various grades of nitrocellulose. Accordingly, to support the applicants' contention of generality with respect to the polymer used, corn starch and poly(vinyl alcohol) were each highly but non-exhaustively nitrated at 25° C. for 1 hour using 30 times their weight of a mixed acid composed of 3 parts of 98% strength sulfuric acid to one part of 60% strength nitric acid. To avoid runaway oxidative decomposition, it was necessary to moderate the heat of reaction with poly(vinyl alcohol) by substituting poly(vinylacetate), from which the acetate groups are readily displaced by the much stronger and more plentiful nitrate groups. The reacted mixes were drowned and neutralized by slowly pouring into a large excess of strongly stirred cool aqueous sodium carbonate solution. The insoluble polymeric nitrate ester was recovered, washed, dried, dissolved in diethyl ketone, filtered, assayed for solids, and tested in coatings formulated as follows, being spin coated on glass at 1000 RPM and dried before imaging:

| Example | 38 | 39 |
|---|---|---|
| Starch nitrate | 1.0 | — |
| Poly(vinyl nitrate) | — | 1.0 |
| Diethylketone | 7.0 | 7.0 |
| n-Propyl alcohol | 3.0 | 3.0 |
| 1,8 Diaminonaphthalene | 0.6 | 0.6 |
| Imaging time, minutes | 10 | 10 |

In each case, a colored image was clearly visible after the patterned exposure to ultraviolet light, one which could be intensified by heat after auto-selective extraction of amine from the unexposed areas as described for Examples 31 and 32.

The stated nitration techniques proved far from optimum for both polymers. Extensive chain degradation occured as indicated by very low solution viscosities. Such shortened chains made these nitrate esters somewhat marginally soluble in water. Consequently, the usual inevitable slight denitration such as occurs when an acid mix of a typical nitrocellulose batch is "drowned" into water was, for these supposedly analogous preparations, much more severe, especially for the more soluble shorter chain fragments. The resultant products were, therefore, far from homogeneous as regards both chain length and degree of nitration. Thus, it was not possible for any one solvent or solvent mixture to simultaneously be acceptably marginal in dissolving power for all chains of such heterogeneously constituted polymer mixtures and attempts at complete selective solvent extractive removal of all materials from the unexposed areas alone were, therefore, only partially successful. It will be obvious to those skilled in the art, however, that such difficulties would not be expected had commercially homogeneous nitrate ester polymer preparations of these chemical classes been available and used.

The specific embodiments described herein are meant to be exemplary only, and various modifications will be apparent to those of any skill in the art. The claims below are intended to cover all such modifications as fall within the true spirit and scope of the invention.

We claim:

1. A photosensitive imaging system suitable for producing an image in response to exposure to electromagnetic radiation, consisting essentially of a molecularly intimate and homogeneous admixture of at least one basic, aromatic amine and an oxidizer which oxidizes the basic aromatic amine on said exposure of said system to electromagnetic radiation, said oxidizer consisting essentially of a polymer polynitrate ester having a viscosity in the range of about 0.1 to about 5000 seconds, the aromatic amine comprising a compound of the following formula:

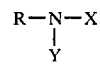

wherein R is an aromatic nucleus substituted either directly or by nitrogen or oxygen bonds with members of the group of hydrogen, halogen, alkyl, aryl and alkaryl groups, and X and Y are selected from the group of hydrogen, hydroxyl, alkyl, aryl, and alkaryl groups provided that X and Y are not both hydroxyl, such that said aromatic amine is relatively basic, such basicity not being substantially nullified by salt or amide formation.

2. The system of claim 1, wherein the aromatic nucleus is selected from the group of benzene, naphthalene and anthracene.

3. The system of claim 1, wherein the polymer is a member of the group of nitrocellulose, nitrostarch, poly(vinylnitrate), and mixtures thereof.

4. The system of claim 1, wherein the polymer has at least one amine-accessible nitrate ester group per eight atoms in the polymer chain.

5. The system of claim 1, wherein the amine comprises 1,8-diamino naphthalene.

6. The system of claim 5, wherein the polymer comprises nitrocellulose.

7. The system of claim 6, wherein the nitrocellulose comprises from about 10 to about 13.5% nitrogen content and has a viscosity of from about 0.125 to about 1,500 seconds.

8. The system of claim 7, wherein the nitrocellulose comprises from about 11.7 to about 12% nitrogen and has a viscosity of from about 0.25 to about 10 seconds.

9. A photoresist system comprising the photosensitive imaging system of claim 1.

10. The system of claim 1, wherein the aromatic amine is selected from the group of 1-naphthylamine, 2-naphthylamine, 4-chloro-1,3-phenylenediamine, 3-amino-9-ethylcarbazole, o-toluidine, m-phenylenediamine, p-anilinophenol, 2,5-dimethoxy aniline, 3,3'-dimethyoxybenzidene, 1,5-diaminonaphthalene, 1,8-diaminonaphthalene, diphenylamine, triphenylamine, 6-dimethylaminoquinaldine, tris-4-(N,N-dimethylanilino)methane, 4-methoxyphenylhydroxylamine, diphenylhydroxylamine, indole, N-vinyl carbazole, and p-dimethylaminobenzaldehyde.

11. The system of claim 1, wherein the amine is a primary amine.

12. A photosensitive system consisting essentially of a molecularly intimate and homogeneous admixture of at least one polymer polynitrate ester with at least one basic, aromatic amine, said system having the property of becoming selectively solvent removable only upon selective exposure to light, said polymer having a viscosity in the range of about 0.1 to about 5,000 seconds, wherein the basic aromatic amine comprises a compound of the following formula:

$$R-N-X$$
$$\;\;\;\;\;\;|$$
$$\;\;\;\;\;\;Y$$

wherein R is an aromatic nucleus substituted either directly or by nitrogen or oxygen bonds with members of the group of hydrogen, halogen, alkyl, aryl, and alkaryl groups, and X and Y are selected from the group of hydrogen, hydroxyl, alkyl, aryl, and alkaryl groups, provided that X and Y are not both hydroxyl, such that said aromatic amine is relatively basic, such basicity not being substantially nullified by salt or amide formation.

13. The system of claim 12, wherein the aromatic nucleus is selected from the group of benzene, naphthalene and anthracene.

14. The system of claim 12, wherein the polymer nitrate ester is a member of the group of nitrocellulose, nitrostarch, poly(vinyl nitrate), and mixtures thereof, and the polymer has a viscosity in the range of about 0.125 to about 1500 seconds.

15. The system of claim 12, wherein the polymer polynitrate ester comprises nitrocellulose, and the polymer has a viscosity in the range of about 0.125 to about 1500 seconds.

16. The system of claim 15, wherein the amine comprises 1,8-diamino naphthalene.

17. The system of claim 12, wherein upon exposure to light the polymer polynitrate ester and amine react to form a composition which is not solvent removable by solvent which swell or dissolves the non-exposed system.

18. The system of claim 12 wherein the parts of the system that have been selectively exposed to light are insoluble in certain solvents for the polymer polynitrate ester.

19. The system of claim 18, wherein the parts of the system that have been exposed to light are insoluble in certain solvents selected from the group of esters and ketones.

20. The system of claim 12, wherein upon selective exposure to light a composition is formed in the exposed areas so that the non-exposed areas are selectively solvent removable by a solvent comprising diisobutyl ketone.

21. A photoresist system comprising the photosensitive system of claim 12.

22. A photosensitive element comprising a substrate having thereon a photosensitive layer consisting essentially of a molecularly intimate and homogeneous admixture of at least one basic, aromatic amine and an oxidizer which oxidizes the basic aromatic amine on exposure of said element to electromagnetic radiation, said oxidizer consisting essentially of a polymer polynitrate ester having a viscosity in the range of about 0.1 to about 5,000 seconds, the aromatic amine comprising a compound of the following formula:

$$R-N-X$$
$$\;\;\;\;\;\;|$$
$$\;\;\;\;\;\;Y$$

wherein R is an aromatic nucleus substituted either directly or by nitrogen or oxygen bonds with members of the group of hydrogen, halogen, alkyl, aryl and alkaryl groups, and X and Y are selected from the group of hydrogen, hydroxyl, alkyl, aryl, and alkaryl groups provided that X and Y are not both hydroxyl, such that said aromatic amine is relatively basic, such basicity not being substantially nullified by salt or amide formation.

23. The photosensitive element of claim 22, wherein the aromatic nucleus is selected from the group of benzene, naphthalene and anthracene.

24. The photosensitive element of claim 22, wherein the polymer has at least one amine-accessible nitrate ester group per eight atoms in the polymer chain.

25. The photosensitive element of claim 22, wherein the amine comprises 1,8-diamino naphthalene.

26. The photosensitive element of claim 25 wherein the polymer comprises nitrocellulose.

27. The photosensitive element of claim 26, wherein the nitrocellulose comprises from about 10 to about 13.5% nitrogen content and has a viscosity of from about 0.125 to about 1,500 seconds.

28. The photosensitive element of claim 22, wherein the nitrocellulose comprises from about 11.7 to about 12% nitrogen and has a viscosity of from about 0.25 to about 10 seconds.

29. The photosensitive element of claim 22, wherein the aromatic amine is selected from the group of 1-naphthylamine, 2-naphthylamine, 4-chloro-1,3-phenylenediamine, 3-amino-9-ethylcarbazole, o-toluidine, m-phenylenediamine, p-anilinophenol, 2,5-dimethoxy aniline, 3,3'-dimethyoxybenzidene, 1,5-diaminonaphthalene, 1,8-diaminonaphthalene, diphenylamine, triphenylamine, 6-dimethylaminoquinaldine, tris-4-(N,N-dimethylanilino)methane, 4-methoxyphenylhydroxylamine, diphenylhydroxylamine, indole, N-vinyl carbazole, and p-dimethylaminobenzaldehyde.

30. The photosensitive element of claim 22, wherein the amine is a primary amine.

31. The photosensitive element of claim 22, wherein said polymer polynitrate ester has a viscosity in the range of about 0.1 to about 5,000 seconds.

32. The photosensitive element of claim 22 wherein said substrate is glass.

33. The photosensitive element of claim 22 wherein said substrate is copper.

34. A photosensitive element comprising a substrate having thereon a photosensitive layer consisting essentially of a molecularly intimate and homogeneous admixture of at least one polymer polynitrate ester with at least one basic, aromatic amine, said element having the property of becoming selectively solvent removable only upon selective exposure to light, wherein said polymer has a viscosity in the range of about 0.1 to about 5,000 seconds, and wherein the basic aromatic amine comprises a compound of the following formula:

wherein R is an aromatic nucleus substituted either directly or by nitrogen or oxygen bonds with members of the group of hydrogen, halogen, alkyl, aryl, and alkaryl groups, and X and Y are selected from the group of hydrogen, hydroxyl, alkyl, aryl, and alkaryl groups, provided that X and Y are not both hydroxyl, such that said aromatic amine is relatively basic, such basicity not being substantially nullified by salt or amide formation.

35. The photosensitive element of claim 34, wherein the aromatic nucleus is selected from the group of benzene, naphthalene and anthracene.

36. The photosensitive element of claim 34, wherein the polymer nitrate ester is a member of the group of nitrocellulose, nitrostarch, poly(vinyl nitrate), and mixtures thereof, and the polymer has a viscosity in the range of about 0.125 to about 1,500 seconds.

37. The photosensitive element of claim 34, wherein the polymer polynitrate ester comprises nitrocellulose, and the polymer has a viscosity in the range of about 0.125 to about 1,500 seconds.

38. The photosensitive element of claim 37, wherein the amine comprises 1,8-diamino naphthalene.

39. The photosensitive element of claim 34, wherein upon exposure to light the polymer polynitrate ester and amine react to form a composition which is not solvent removable by solvent which swells or dissolves the non-exposed system.

40. The photosensitive element of claim 34, wherein the parts of the element that have been selectively exposed to light are insoluble in certain solvents fo the polymer polynitrate ester.

41. The photosensitive element of claim 40, wherein the parts of the element that have been exposed to light are insoluble in certain solvents selected from the group of esters and ketones.

42. The photosensitive element of claim 34, wherein upon selective exposure to light a composition is formed in the exposed area so that the non-exposed areas are selectively solvent removable by a solvent comprising diisobutyl ketone.

43. A photosensitive composition consisting essentially of a solvent having dissolved therein at least one basic, aromatic amine and an oxidizer which oxidizes the basic aromatic amine on said exposure of said composition to electromagnetic radiation, and an oxidizer consisting essentially of a polymer polynitrate ester, having a viscosity in the range of about 0.1 to about 5,000 seconds the aromatic amine comprising a compound of the following formula:

wherein R is an aromatic nucleus substituted either directly or by nitrogen or oxygen bonds with members of the group of hydrogen, halogen, alkyl, aryl and alkaryl groups, and X and Y are selected from the group of hydrogen, hydroxyl, alkyl, aryl, and alkaryl groups provided that X and Y are not both hydroxyl, such that said aromatic amine is relatively basic, such basicity not being substantially nullified by salt or amide formation.

44. The composition of claim 43, wherein said polymer has a viscosity in the range of about 0.1 to about 5,000 seconds.

45. The composition of claim 43, wherein the aromatic nucleus is selected from the group of benzene, naphthalene and anthracene.

46. The composition of claim 43, wherein the polymer is a member of the group of nitrocellulose, notrostarch, poly(vinyl nitrate), and mixtures thereof.

47. The composition of claim 43, wherein the polymer has at least one amine-accessible nitrate ester group per eight atoms in the polymer chain.

48. The composition of claim 43, wherein the amine comprises 1,8-diamino naphthalene.

49. The composition of claim 43, wherein the polymer comprises nitrocellulose.

50. The composition of claim 49, wherein the nitrocellulose comprises from about 10 to about 13.5% nitrogen content and has a viscosity of from about 0.125 to about 1,500 seconds.

51. The composition of claim 50, wherein the nitrocellulose comprises from about 11.7 to about 12% nitrogen and has a viscosity of from about 0.25 to about 10 seconds.

52. The composition of claim 43, wherein the aromatic amine is selected from the group of 1-naphthylamine, 2-naphthylamine, 4-chloro-1,3-phenylenediamine, 3-amino-9-ethylcarbazole, o-toluidine, m-phenylenediamine, p-anlilinophenol, 2,5-dimethoxy aniline, 3,3'-dimethyoxybenzidene, 1,5-diaminonaphthalene, 1,8-diaminonaphthalene, diphenylamine, triphenylamine, 6-dimethylaminoquinaldine, tris-4-(N,N-dimethylanilino)methane, 4-methoxyphenylhydroxylamine, diphenylhydroxylamine, indole, N-vinyl carbazole, and p-dimethylaminobenzaldehyde.

53. The composition of claim 43, wherein the amine is a primary amine.

54. A photosensitive composition consisting essentially of a solvent having dissolved therein at least one polymer polynitrate ester with at least one basic, aromatic amine, said composition upon evaporation of the solvent to form a moleculary intimate and homogeneous admixture in a photosensitive layer having the property of becoming selectively solvent removable only upon selective exposure to light, wherein said polymer has a viscosity in the range of about 0.1 to about 5,000 seconds, and wherein the basic aromatic amine comprises a compound of the following formula:

wherein R is an aromatic nucleus substituted either directly or by nitrogen or oxygen bonds with members of the group of hydrogen, halogen, alkyl, aryl, and alkaryl groups, and X and Y are selected from the group of hydrogen, hydroxyl, alkyl, aryl, and alkaryl groups, provided that X and Y are not both hydroxyl, such that said aromatic amine is relatively basic, such basicity not being substantially nullified by salt or amide formation.

55. The composition of claim 54, wherein the aromatic nucleus is selected from the group of benzene, naphthalene and anthracene.

56. The composition of claim 54, wherein the polymer nitrate ester is a member of the group of nitrocellulose, nitrostarch, poly(vinyl nitrate), and mixtures thereof, and the polymer has a viscosity in the range of about 0.125 to about 1,500 seconds.

57. The composition of claim 54, wherein the polymer polynitrate ester comprises nitrocellulose, and the polymer has a viscosity in the range of about 0.125 to about 1,500 seconds.

58. The composition of claim 57, wherein the amine comprises 1,8-diamino naphthalene.

59. The composition of claim 54, wherein upon evaporation of the solvent to form a photosensitive layer and upon selective exposure to light the polymer polynitrate ester and amine react to form a composition which is not solvent removable by solvent which swells or dissolves the non-exposed portion of layer.

60. The composition of claim 54, wherein the parts of the layer that have been selectively exposed to light are insoluble in certain solvents for the polymer polynitrate ester.

61. The composition of claim 60, wherein the parts of the layer that have been exposed to light are insoluble in certain solvents selected from the group of esters and ketones.

62. The composition of claim 54, wherein upon selective exposure to light a composition is formed in the exposed areas so that the non-exposed areas are selectively solvent removable by a solvent comprising diisobutyl ketone.

* * * * *